United States Patent
Shimoda (10) Patent No.: US 6,636,066 B2
(45) Date of Patent: Oct. 21, 2003

(54) SEMICONDUCTOR INTEGRATED CIRCUIT AND METHOD FOR TESTING THE SAME

(75) Inventor: Hirotaka Shimoda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/001,796

(22) Filed: Dec. 5, 2001

(65) Prior Publication Data

US 2002/0101249 A1 Aug. 1, 2002

(30) Foreign Application Priority Data

Dec. 5, 2000 (JP) .................................. 2000-370533

(51) Int. Cl.[7] .......................... G01R 31/26; G01R 1/04
(52) U.S. Cl. .................. 324/765; 324/719; 324/763; 324/158.1; 324/761
(58) Field of Search .................. 324/719, 765, 324/763, 158.1, 761; 714/43; 326/87, 86, 30, 33

(56) References Cited

U.S. PATENT DOCUMENTS

| | | | | |
|---|---|---|---|---|
| 5,321,354 A | * | 6/1994 | Ooshima et al. | 324/765 |
| 5,471,153 A | * | 11/1995 | Martin | 324/763 |
| 5,521,524 A | * | 5/1996 | Houston | 324/765 |
| 5,617,038 A | * | 4/1997 | Houston | 324/765 |
| 5,670,890 A | * | 9/1997 | Colwell et al. | 324/765 |
| 5,760,598 A | * | 6/1998 | Ayers et al. | 324/765 |
| 5,760,599 A | * | 6/1998 | Ehiro | 324/765 |
| 6,150,831 A | * | 11/2000 | Asai et al. | 324/765 |

FOREIGN PATENT DOCUMENTS

JP   11-30649   2/1999

* cited by examiner

Primary Examiner—Andrew H. Hirshfeld
Assistant Examiner—Wasseem H. Hamdan
(74) Attorney, Agent, or Firm—Young & Thompson (57) ABSTRACT

In measuring the resistance value of an output buffer, a supply voltage is supplied to a first P-channel transistor in its source through an ammeter provided within an IC tester, a ground potential is supplied from the IC tester to a first N-channel transistor in its source, and a voltmeter provided within the IC tester is connected to a first external output terminal. A test control signal is then brought to a high level. Further, a test signal of a plurality of bits, which brings only a first test control signal to a high level while brining the remaining 2nd to nth test control signals to a low level, is input into a decoder. As a result, the first P-channel transistor and the first N-channel transistor are brought to an ON state, while 2nd to nth external output terminals are brought to a high-impedance state.

6 Claims, 6 Drawing Sheets

1 AMMETER
2 VOLTMETER
A CONTROL TERMINAL
Y OUTPUT TERMINAL
Ck CONTACT RESISTANCE
APk TERMINAL
Bk OUTPUT BUFFER
D1,D2 INPUT TERMINAL
GND GROUND POTENTIAL
INk DATA INPUT TERMINAL
IV1k, IV2k INVERTER
NANDk NAND CIRCUIT
NORk NOR CIRCUIT
Pk EXTERMNAL OUTPUT TERMINAL
Rj ···
SEL1k, SEL2k SELECTOR
Ten, Tk TEST CONTROL SIGNAL
TrNk N-CHANNEL TRANSISTOR
TrPk P-CHANNEL TRANSISTOR
VDD SUPPLY VOLTAGE

A CONTROL TERMINAL
Y OUTPUT TERMINAL
AP1, AP2, APn TERMINAL
B1, B2, Bn OUTPUT BUFFER
DEC DECODER
D1, D2 INPUT TERMINAL
IN1, IN2, INn DATA INPUT TERMINAL
IV1n, IV2n, IV11, IV12, IV21, IV22 INVERTER
NAND1, NAND2, NANDn NAND CIRCUIT
NOR1, NOR2, NORn NOR CIRCUIT
P1, P2, Pn EXTERNAL OUTPUT TERMINAL
SEL1n, SEL2n, SEL11, SEL12, SEL21, SEL22 SELECTOR
T1, T2, Ten, Tn TEST CONTROL SIGNAL
TrN1, TrN2, TrNn N-CHANNEL TRANSISTOR
TrP1, TrP2, TrPn P-CHANNEL TRANSISTOR
VDD SUPPLY VOLTAGE

FIG. 3

1 AMMETER
2 VOLTMETER
A CONTROL TERMINAL
Y OUTPUT TERMINAL
Ck CONTACT RESISTANCE
APk TERMINAL
Bk OUTPUT BUFFER
D1,D2 INPUT TERMINAL
GND GROUND POTENTIAL
INk DATA INPUT TERMINAL
IV1k, IV2k INVERTER
NANDk NAND CIRCUIT
NORk NOR CIRCUIT
Pk EXTERMNAL OUTPUT TERMINAL
Rj ...
SEL1k,SEL2k SELECTOR
Ten,Tk TEST CONTROL SIGNAL
TrNk N-CHANNEL TRANSISTOR
TrPk P-CHANNEL TRANSISTOR
VDD SUPPLY VOLTAGE

A CONTROL TERMINAL
Y OUTPUT TERMINAL
AP1, AP2, APn TERMINAL
B1, B2, Bn OUTPUT BUFFER
DEC DECODER
D1, D2 INPUT TERMINAL
IN1, IN2, INn DATA INPUT TERMINAL
IV1n, IV2n, IV11, IV12, IV21, IV22 INVERTER
NAND1, NAND2, NANDn NAND CIRCUIT
NOR1, NOR2, NORn NOR CIRCUIT
P1, P2, Pn EXTERNAL OUTPUT TERMINAL
Pout1, Pout2 OUTPUT TERMINAL
S1, S2 CONSTANT VOLTAGE SOURCE
SEL1n, SEL2n, SEL3n, SEL4n, SEL11, SEL12, SEL21
SEL22, SEL31, SEL32, SEL41, SEL42 SELECTOR
T1, T2, Ten, Tn TEST CONTROL SIGNAL
TrN1, TrN2, TrNn N-CHANNEL TRANSISTOR
TrP1, TrP2, TrPn P-CHANNEL TRANSISTOR
VDD SUPPLY VOLTAGE

FIG. 6

A CONTROL TERMINAL
Y OUTPUT TERMINAL
AP1, AP2, APn TERMINAL
B1, B2, Bn OUTPUT BUFFER
DEC DECODER
D1, D2 INPUT TERMINAL
IN1, IN2, INn DATA INPUT TERMINAL
IV1n, IV2n, IV11, IV12, IV21, IV22 INVERTER
NAND1, NAND2, NANDn NAND CIRCUIT
NOR1, NOR2, NORn NAND CIRCUIT
P1, P2, Pn EXTERNAL OUTPUT TERMINAL
SEL1n, SEL2n, SEL11, SEL12, SEL21, SEL22 SELECTOR
T1, T2, Ten, Tn TEST CONTROL SIGNAL
TrN1, TrN2, TrNn N-CHANNEL TRANSISTOR
TrP1, TrP2, TrPn P-CHANNEL TRANSISTOR
VDD SUPPLY VOLTAGE

SEMICONDUCTOR INTEGRATED CIRCUIT AND METHOD FOR TESTING THE SAME

FIELD OF THE INVENTION

The invention relates to a semiconductor integrated circuit provided with a plurality of output buffers and a method for testing the same, and more particularly to a semiconductor integrated circuit, which can realize the measurement of a resistance value of output buffers with high accuracy and a method for testing the same.

BACKGROUND OF THE INVENTION

In performing a test on electric characteristics of a semiconductor integrated circuit, it is common practice to connect an IC (integrated circuit) tester to the semiconductor integrated circuit through a test substrate. This method is disadvantageous in that, when the resistance value of output buffers of the semiconductor integrated circuit as the test object is measured, a measurement error occurs due to a contact resistance caused by the connection of the IC tester to the test substrate.

Figure 1:
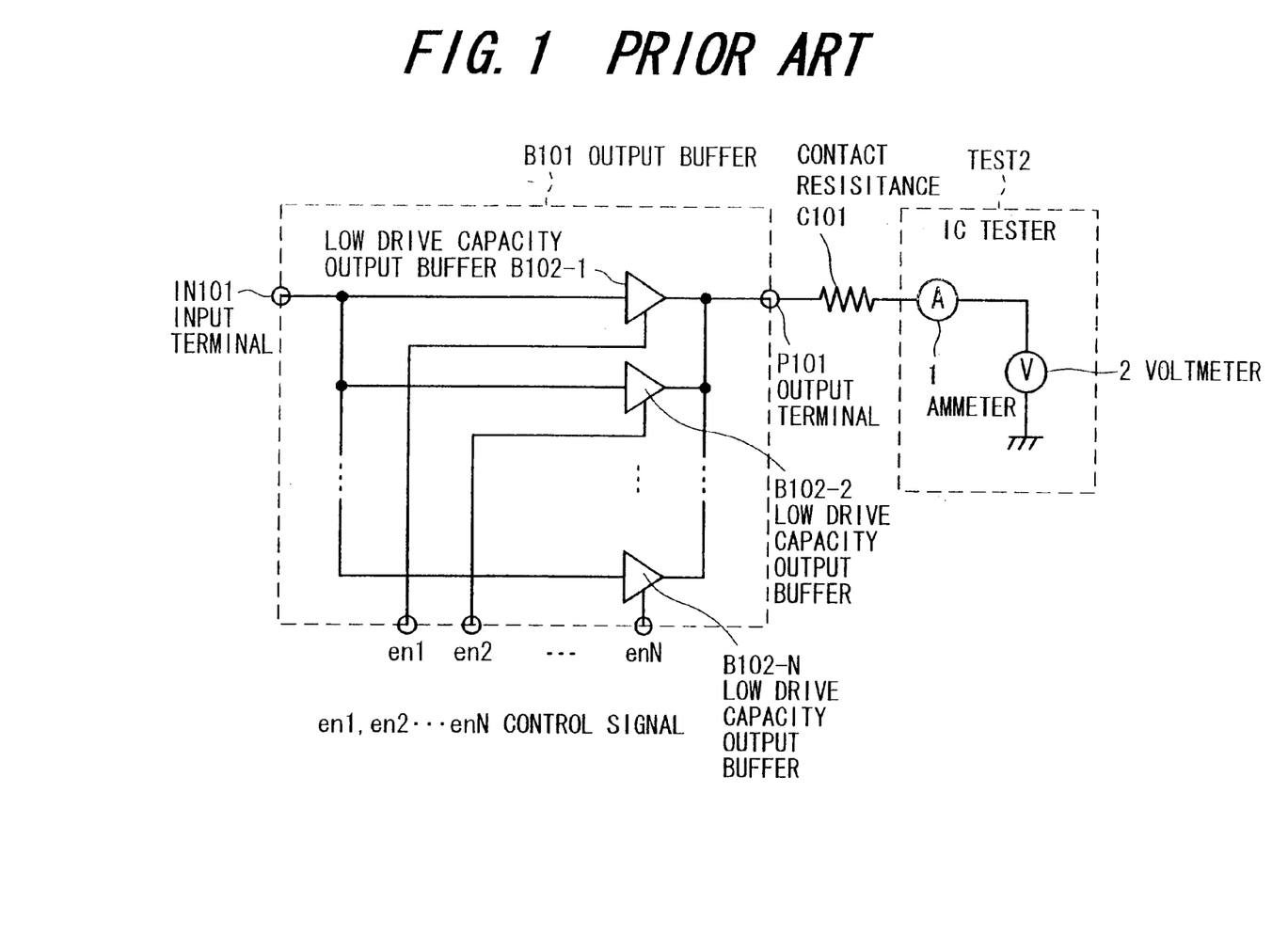
FIG. 1 is a block diagram showing the structure of an output buffer and an IC tester provided in a conventional semiconductor integrated circuit.

Accordingly, a conventional testing method proposed for reducing the measurement error derived from the contact resistance will be explained. This testing method is disclosed, for example, in Japanese Patent No. 2765508. FIG. 1 is a block diagram showing the structure of an output buffer and an IC tester provided in a conventional semiconductor integrated circuit.

When the output buffer provided in the semiconductor integrated circuit is a high-drive output buffer, the output buffer B101 comprises low-drive output buffers B102-1 to B102-N, which are connected parallel to each other, between an input terminal IN101 and an output terminal P101. Control signals en1 to enN are supplied respectively to the output buffers 102-1 to 102-N.

On the other hand, in the IC tester TEST2, an ammeter 1 and a voltmeter 2, which have been connected in series to each other, are provided between an input terminal and a ground.

In the conventional semiconductor integrated circuit having the above construction, at the time of usual operation, all the control signals en1 to enN are made valid to operate all the low-drive output buffers B102-1 to B102-N. This permits the signal input into the input terminal IN101 to be output by high-capability drive from the output terminal P101.

On the other hand, in measuring the resistance value of the high-drive output buffer B101 with the IC tester TEST2, only a control signal eni, wherein i represents a natural number of 1 to not more than N, corresponding to the ith output buffer B102-i among the N low-drive output buffers, B102-1 to B102-N, is made valid while control signals enj (j≠i) corresponding to the other low-drive output buffers are made invalid. As a result, the input signal is driven by the output buffer B102-i. On the other hand, the output of the other output buffers is brought to a high-impedance state (Hi-z), and the logical level of the output terminal P101 is brought to a high level or a low level. In this state, the resistance value of the low-drive output buffer B102-i can be measured with the IC tester TEST2. For all the low-drive output buffers B102-1 to B102-N, this operation may be successively carried out while varying the i value to measure the resistance value of the high-drive output buffer B101.

According to this testing method, when the high-drive output buffer is realized by a single high-drive output buffer, the resistance value at the time of the measurement is R+R0 wherein R0 represents the resistance value of a contact resistor C101 caused by the connection of the IC tester TEST2 to the test substrate and R represents the resistance value of the high-drive output buffer B101, whereas, when the high-drive output buffer B101 is constituted by N low-drive output buffers, the resistance value at the time of measurement is N×R+R0. Therefore, when the high-drive output buffer B101 is constituted by N low-drive output buffers, the measurement error caused by the contact resistance between the IC tester TEST2 and the test substrate can be lowered.

In this conventional testing method, however, although the measurement error caused by the contact resistance between the IC tester TEST2 and the test substrate can be lowered, the measurement error caused by the contact resistance cannot be fully eliminated.

Semiconductor integrated circuits have recently become used in various applications, and this has led to various demands for electrical characteristics of semiconductor integrated circuits. For example, one of these demands is that a plurality of output terminals are provided and, regarding electrical characteristics of each output terminal, the resistance value for the output buffers connected respectively to the output terminal should be constant. When a test is performed with an IC tester on whether or not the resistance value of the plurality of high-drive output buffers is constant, the contact resistance caused by the connection of the semiconductor integrated circuit to the IC tester through a test substrate exists between each high-drive output buffer and the IC tester. For this reason, unless the contact resistance between each high-drive output buffer and the IC tester is constant, a measurement error attributable to a variation in contact resistance occurs. In the above conventional testing method, however, the measurement error caused by the contact resistance cannot be fully eliminated, although a reduction in the measurement error is possible. Therefore, when a variation in contact resistance has occurred, disadvantageously, the test on whether or not the resistance value of the plurality of high-drive output buffers is constant cannot be accurately performed.

Accordingly, in order to measure the resistance value of input/output buffers while eliminating the influence of the contact resistance, a method for testing semiconductor circuits is disclosed, for example, in Japanese Patent Application Laid-Open No. 11-30649 (that corresponds to U.S. Pat. No. 6,150,831). In this publication, a circuit comprising a plurality of high-speed, small-amplitude input/output buffers connected to a control circuit is shown. Each high-speed, small-amplitude input/output buffer is provided with two transistors as two semiconductor switches which have been connected in series to each other. This publication describes that these two transistors are simultaneously brought to ON state to allow a breakthrough current to flow into these transistors, whereby the resistance value can be measured.

In Japanese Patent Application Laid-Open No. 11-30649, a timing chart showing the operation of the circuit shown in the drawing is described. From the timing chart and the description of the specification, however, it is not clear that, among the signals input into the high-speed, small-amplitude input/output buffers, which signal is a signal to be driven and which signal is a signal for controlling the operation of the high-speed, small-amplitude input/output buffer. Therefore, all of predetermined resistance values cannot be actually measured. Further, the voltage applied to the gate of each transistor is often brought to an unnecessarily large value. In this case, the semiconductor circuit is deteriorated in a short period.

SUMMARY OF THE INVENTION

In view of the above problems of the prior art, the invention has been made, and it is an object of the invention to provide a semiconductor integrated circuit and a method for testing the same, which can realize the measurement of the resistance value of high-drive output buffers with high accuracy without undergoing the influence of contact resistance caused between the semiconductor integrated circuit and an IC tester, and preferably can suppress the deterioration of the circuit.

According to the first feature of the invention, a semiconductor integrated circuit comprises:

a plurality of output buffers each comprising a P-channel transistor and an N-channel transistor, the P-channel transistor in its drain and the N-channel transistor in its drain having been commonly bonded to an external output terminal; and a control circuit which, in measuring the resistance value of the plurality of output buffers, selects one output buffer and brings the P-channel transistor and the N-channel transistor provided in the selected output buffer to an ON state while bringing the external output terminals of the remaining output buffers to a high-impedance state.

According to the invention, the P-channel transistor and the N-channel transistor provided in the output buffer selected by the control circuit can be simultaneously brought to an ON state. In this state, a supply potential is supplied, for example, to the P-channel transistor by using an IC test circuit, a ground potential is supplied to the N-channel transistor, and a stationary current, which flows into the P-channel transistor and the N-channel transistor, and the output voltage of the output buffer are measured, whereby the resistance values of the P-channel transistor and the N-channel transistor can be measured. Therefore, even when the semiconductor integrated circuit is connected to the IC tester through a test substrate, the resistance value of the output buffer can be measured with very high accuracy without undergoing the influence of the contact resistance.

The control circuit, when the external output terminals of the remaining output buffers are brought to a high-impedance state, may bring the P-channel transistor and the N-channel transistor provided in the remaining output buffers to an OFF state. The output buffer may comprise: a first selector which, when the output buffer has been selected by the control circuit, sends a low-level signal to the P-channel transistor in its gate and, in the other cases, sends a signal on a level corresponding to the level of a signal input into a data input terminal; and a second selector which, when the output buffer has been selected by the control circuit, sends a high-level signal to the N-channel transistor in its gate and, in the other cases, sends a signal on a level corresponding to the level of a signal input into a data input terminal.

Further, a supply potential provided in the external tester may be supplied to the P-channel transistor in its source provided in the output buffer selected by the control circuit, and a ground potential provided in said tester may be supplied to the N-channel transistor in its source.

According to the second feature of the invention, a method for testing a semiconductor integrated circuit comprises the steps of: providing a semiconductor integrated circuit comprising a plurality of output buffers each comprising a P-channel transistor and an N-channel transistor, the P-channel transistor in its drain and the N-channel transistor in its drain having been commonly bonded to an external output terminal; selecting one output buffer from the plurality of output buffers; bringing the P-channel transistor and the N-channel transistor provided in the selected output buffer to an ON state; bringing the P-channel transistor and the N-channel transistor provided in the remaining output buffers to an OFF state and bringing external output terminals of the remaining output buffers to a high-impedance state; and allowing a current to flow into the P-channel transistor and the N-channel transistor, which have been brought to an ON state, to measure the resistance values of the P-channel transistor and the N-channel transistor.

Preferably, the step of measuring the resistance value is performed for all the output buffers while varying the output buffer selected by the step of selecting one output buffer.

BRIEF DESCRIPTION OF THE DRAWINGS

The invention will be explained in more detail in conjunction with the appended drawings, wherein.

DESCRIPTION OF THE PREFERRED EMBODIMENTS

Figure 2:
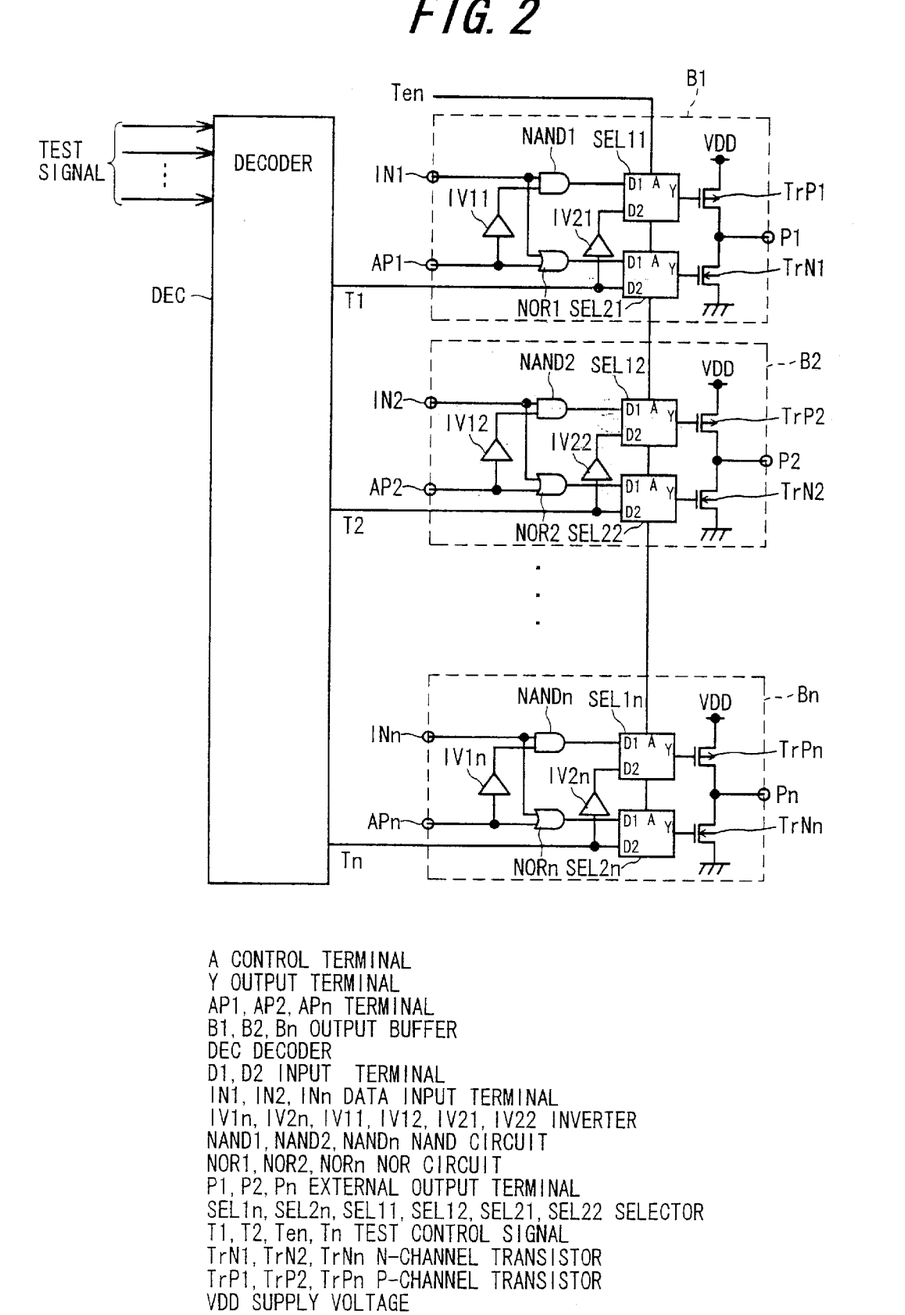
FIG. 2 is a block diagram showing the structure of a semiconductor integrated circuit according to a first preferred embodiment of the invention.

Preferred embodiments of the semiconductor integrated circuit and the method for testing the same according to the invention will be explained in detail in conjunction with the accompanying drawings. A plurality of output buffers are provided in each semiconductor integrated circuit described below according to preferred embodiments of the invention. FIG. 2 is a block diagram showing the structure of a semiconductor integrated circuit according to the first preferred embodiment of the invention.

The first preferred embodiment of the invention is provided with relatively high-drive n output buffers, i.e., B1 to Bn. The output buffers B1 to Bn are identical to each other in structure and function. In the output buffer Bk wherein k is a natural number of 1 to n, a NAND circuit NANDk and a NOR circuit NORk are provided in which one input terminal is connected to a data input terminal INk. Further, a selector SEL1k, into which an output signal from the NAND circuit NANDk is input, is provided at one input terminal D1, and a selector SEL2k, into which an output signal from the NOR circuit NORk is input, is provided at one input terminal D1. A test control signal Ten is input into a control terminal A in all the selectors SEL1k and SEL2k. When the test control signal Ten is on a high level, each selector outputs, from an output terminal Y, a signal which is input into the other input terminal D2, while, when the test control signal Ten is on a low level, each selector outputs, from the output terminal Y, a signal which is input into the input terminal D1.

The output buffer Bk is further provided with a terminal APk that is connected to the other input terminal of the NOR circuit NORk and permits the input of an output enabling signal which, at the time of the authorization of output from an external output terminal Pk, is brought to a low level. Further, the output buffer Bk is provided with an inverter IV1k, which inverts the output enabling signal and sends the inverted signal to the other input terminal of the NAND circuit NAND1. A decoder DEC, which decodes a test signal and sends, to each output buffer Bk, a test control signal Tk for controlling the operation, and a control circuit (not shown) for outputting a test control signal Ten and a test signal are provided in the semiconductor integrated circuit according to this preferred embodiment. The output buffer Bk is provided with an inverter IV2k which inverts a test control signal Tk and sends the inverted signal to the input terminal D2 in the selector SEL1k. The output buffer Bk is further provided with a P-channel transistor (P-ch) TrPk, in which an output singal from the selector SEL1k is input into its gate, and an N-channel transistor (N-ch) TrNk in which an output signal from the selector SEL2k is input into its gate. A supply voltage VDD is supplied to the P-channel transistor TrPk in its source, and a ground potential is supplied to the N-channel transistor TrNk in its source. The drain of the P-channel transistor TrPk and the drain of the N-channel transistor TrNk are commonly bonded to the external output terminal Pk.

Figure 3:
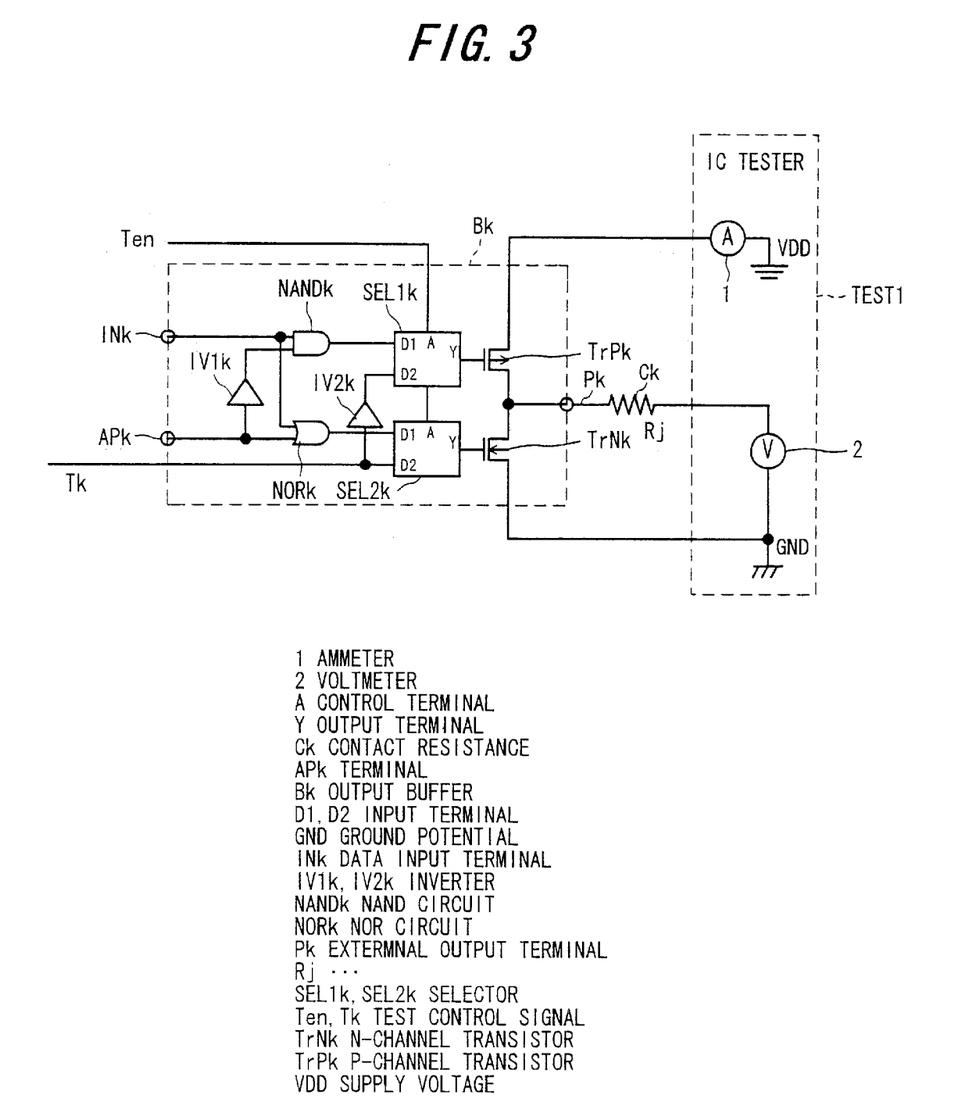
FIG. 3 is a block diagram showing a method for measuring the resistance value of an output buffer provided in the semiconductor integrated circuit according to the first preferred embodiment of the invention.
Figure 4:
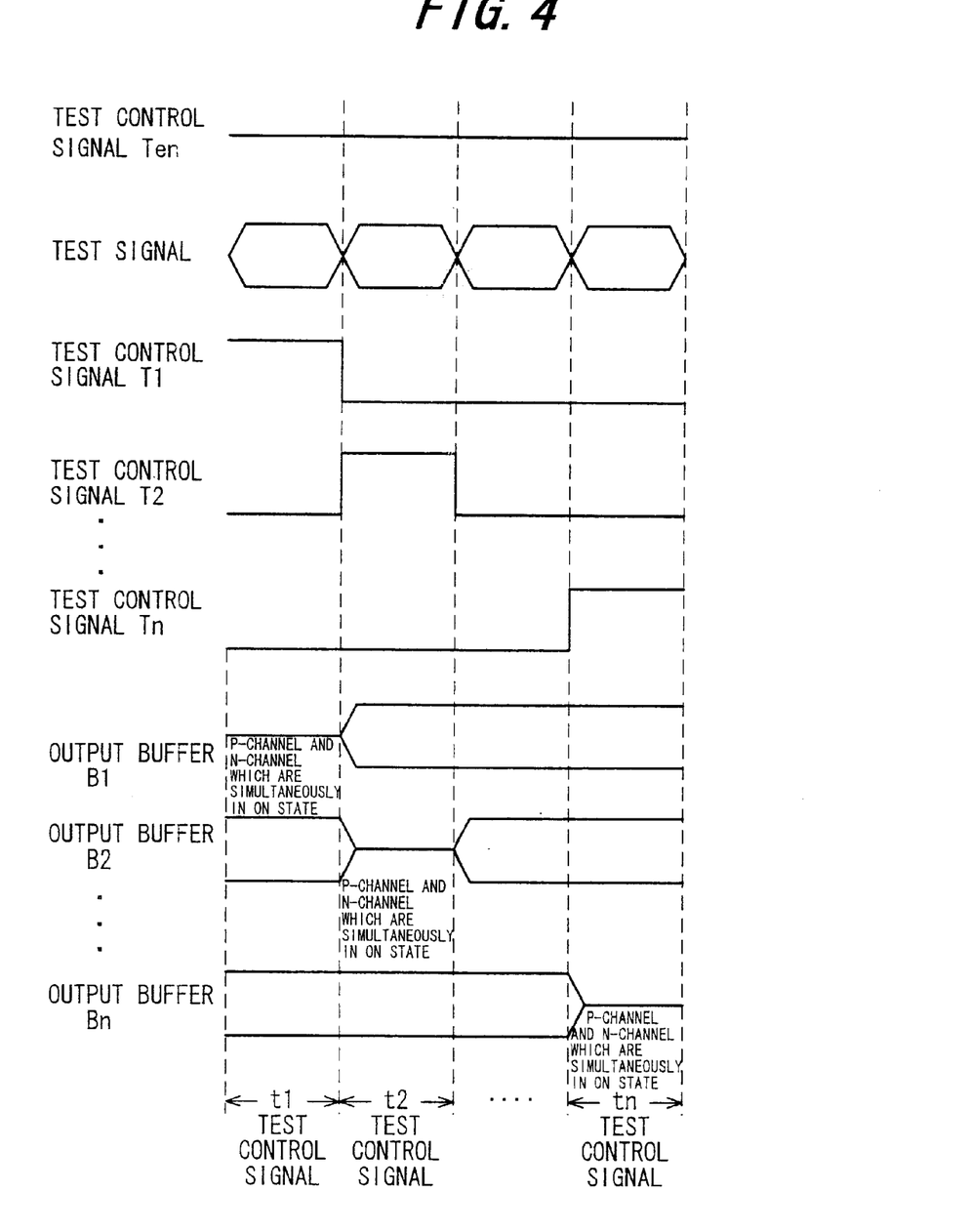
FIG. 4 is a timing chart showing the method for measuring the resistance value of the output buffer provided in the semiconductor integrated circuit according to the first preferred embodiment of the invention.

Next, the operation of the semiconductor integrated circuit having the above construction according to the first preferred embodiment will be explained. FIG. 3 is a block diagram showing a method for measuring the resistance value of the output buffer provided in the semiconductor integrated circuit according to the first preferred embodiment of the invention. FIG. 4 is a timing chart showing a method for measuring the resistance value of the output buffer provided in the semiconductor integrated circuit according to the first preferred embodiment of the invention. Table 1 below is a truth table showing the operation of each selector.

TABLE 1

| Input signal | | Output signal | |
|---|---|---|---|
| D1 | D2 | A | Y |
| 1 (high) | Independent | 0 (low) | 1 (high) |
| 0 (low) | Independent | 0 (low) | 0 (low) |
| Independent | 1 (high) | 1 (high) | 1 (high) |
| Independent | 0 (low) | 1 (high) | 0 (low) |

At the time of usual operation in the first preferred embodiment, the test control signal Ten supplied to each output buffer Bk is brought to a low level. As a result, the selector SEL1k outputs the signal, input into its input terminal D1, from the output terminal Y. The selector SEL2k outputs the signal, input into its input terminal D1, from the output terminal Y. Therefore, when the output enabling signal input into the terminal APk is on a low level, the data input into the data input terminal INk driven by the P-channel transistor TrPk or the N-channel transistor TrNk is output without the inversion of the logic level from the external output terminal Pk of the output buffer Bk. When the output enabling signal is on a high level, the external output terminal Pk is brought to a high-impedance state (Hi-z). In this case, there is no output from the external output terminal Pk. Table 2 is a truth table which summarizes combinations of them.

TABLE 2

| Dk | APk | Pk |
|---|---|---|
| 1 | 0 | 1 |
| 0 | 0 | 0 |
| 1 | 1 | Hi - z |
| 0 | 1 | Hi - z |

On the other hand, when the resistance value of the output buffer Bk is measured, as shown in FIG. 3, a supply voltage VDD is supplied to the P-channel transistor TrPk in its source through an ammeter 1 provided within an IC tester TEST1. A ground potential GND is supplied from the IC tester TEST1 to the N-channel transistor TrNk in its source, and a voltmeter 2 provided within the IC tester TEST1 is connected to the external output terminal Pk. As a result, contact resistance Ck occurs between the external output terminal Pk and the IC tester TEST1. Although contact resistance also occurs between each source of the P-channel transistor TrPk and the N-channel transistor TrNk and the IC tester TEST1, the contact resistance can be easily brought to a negligible level.

The semiconductor integrated circuit is controlled as follows. At the outset, as shown in FIG. 4, the test control signal Ten is brought to a high level. Further, in a period t1, a test signal of a plurality of bits, which only a test control signal T1 is brought to a high level while the other test control signal T2 and Tn are brought to a low level, is input into a decoder DEC.

As a result, in the output buffer B1, the test control signal T1 on a high level as such is intput into a selector SEL 21 in its input terminal D2 and, in addition, is inverted by an inverter IV21 and is input into a selector SEL11 in its input terminal D2. Therefore, the selector SEL11 outputs the low-level signal, input into the input terminal D2, from the output terminal Y, and the selector SEL21 outputs the high-level signal, input into the input terminal D2, from the output terminal Y. This brings the P-channel transistor TrP1 and the N-channel transistor TrN1 to an ON state.

On the other hand, in the output buffers B2 to Bn, the low-level test control signals T2 to Tn as such are input into selectors SEL22 to SEL2n in their respective input terminals D2 and, in addition, are inverted by respective inverters IV22 to IV2n and are input into selectors SEL12 to SEL1n in their respective input terminals D2. Therefore, the selectors SEL12 to SEL1n output the high-level signals, input into their input terminals D2, from their output terminals Y, and the selectors SEL22 to SEL2n output the low-level signals, input into their input terminals D2, from their output terminals Y. For this reason, the P-channel transistors TrP2 to TrPn and the N-channel transistors TrN2 to TrNn are brought to an OFF state, and the external output terminals P2 to Pn are brought to a high-impedance state (Hi-z).

As described above, in such a state that the external output terminals P2 to Pn are on a high-impedance level, a constant current, which flows between the supply potential VDD and the ground potential GND, and an output voltage of the external output terminal P1 are measured. The resistance values of the P-channel transistor TrP1 and the N-channel transistor TrN1 provided in the output buffer B1 are determined based on the measurement results.

Next, in a period t2, a test signal of a plurality of bits, which only a test control signal T2 is brought to a high level while the other test control signals, i.e., T1 and T3 to Tn, are brought to a low level, is input into the decoder DEC.

As a result, in the output buffer B2, the high-level test control signal T2 as such is input into a selector SEL22 in its input terminal D2 and, in addition, is inverted by an inverter IV22 and is input into a selector SEL12 in its input terminal D2. Therefore, the selector SEL12 outputs the low-level signal, and the selector SEL21 outputs the high-level signal. This brings the P-channel transistor TrP2 and the N-channel transistor TrN2 to an ON state.

On the other hand, in the output buffers B1 and B3 to Bn, the low-level test control signals as such are input respectively into selectors SEL21 and SEL23 to SEL2n in their input terminals D2 and, in addition, are inverted respectively by the inverters IV21 and IV23 to IV2n and are input respectively into the selectors SEL11 and SEL13 to SEL1n in their input terminals D2. Therefore, the selectors SEL11 and SEL13 to SEL1n output a high-level signal, and the selectors SEL21 and SEL23 to SEL2n output a low-level signal. For this reason, the P-channel transistors TrP1 and TrP2 to TrPn and the N-channel transistors TrN1 and TrN3 to TrNn are brought to an OFF state, and the external output terminals P1 and P3 to Pn are brought to a high-impedance state (Hi-z).

As described above, in such a state that the external output terminals P1 and P3 to Pn are on a high-impedance level, a constant current, which flows between the supply potential VDD and the ground potential GND, and an output voltage of the external output terminal P2 are measured. The resistance values of the P-channel transistor TrP2 and the N-channel transistor TrN2 provided in the output buffer B2 are determined based on the measurement results.

Next, in periods t3 to t(n-1), while successively bringing test control signals T3, . . . , T(n-1) at given period intervals to a high level by switching the test signal, the resistance value of each of the P-channel transistors TrP3 to TrP(n-1) and the N-channel transitors TrN3 to TrN(n-1) is determined.

Further, in the subsequent period tn, a test control signal Tn is brought to a high level, and, at the same time, test control signals T1 to T(n-1) are brought to a low level. The external output terminals P1 to P(n-1) of the output buffers B1 to B(n-1) are then brought to a high-impedance state to determine the resistance values of the P-channel transistor TrPn and the N-channel transistor TrNn.

Thus, for all the P-channel transistors TrP1 to TrPn and the N-channel transistors TrN1 to TrNn provided in the output buffers B1 to Bn, the resistance value can be determined. In this testing method, for the measurement of a constant current, which flows between the supply potential VDD and the ground potential GND through the two transistors, since the supply potential VDD and the ground potential GND can be connected to each output buffer while suppressing the contact resistance to a negligible level even by a conventional method, it can be said that the measurement error derived from the contact resistance does not occur. Further, for the measurement of the output voltage of the external output terminals P1 to Pk, since no current is flowed into the external output terminals at the time of the measurement, voltage drop derived from contact resistance C1 to Cn does not occur. Therefore, there is no influence of the contact resistance. Thus, according to the first preferred embodiment of the invention, even when the contact resistance Ck exists, any measurement error attributable to the contact resistance does not occur in the measurement of the resistance values of the P-channel transistor TrPk and the N-channel transistor TrNk. By virtue of this, even when the drive capability of the output buffers B1 to Bk is enhanced, the resistance values of the P-channel transistors TrP1 to TrPn and the N-channel transistors TrN1 to TrNn provided in the respective output buffers B1 to Bk can be accurately measured.

Figure 5:
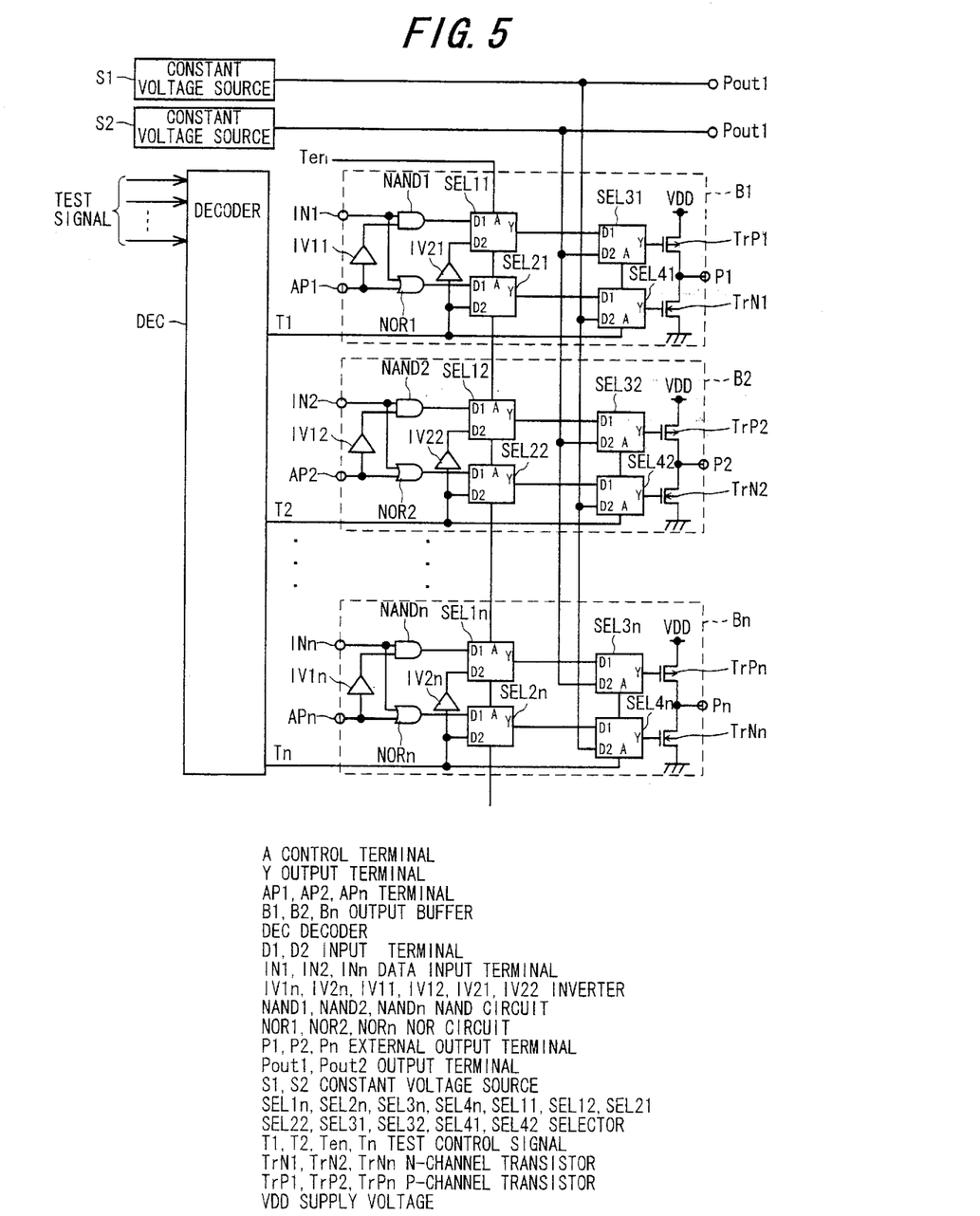
FIG. 5 is a block diagram showing the structure of a semiconductor integrated circuit according to a second preferred embodiment of the invention.

Next, the second preferred embodiment of the invention will be explained. FIG. 5 is a block diagram showing the structure of the semiconductor integrated circuit according to the second preferred embodiment of the invention. In FIG. 5 showing the second preferred embodiment and FIG. 2 showing the first preferred embodiment, like parts are identified with the same reference numerals, and the detailed description thereof will be omitted.

Two constant voltage sources S1 and S2 are provided in the semiconductor integrated circuit according to the second preferred embodiment of the invention. The constant voltage supplied form the constant voltage source S1 is a voltage for operating the N-channel transistors TrN1 to TrNn in an unsaturated region, and the constant voltage supplied from the constant voltage source S2 is a voltage for operating the P-channel transistors TrP1 to TrPn in an unsaturated region. An output terminal Pout1 is connected to the constant voltage source S1, and an output terminal Pout2 is connected to the constant voltage source S2.

Two selectors SEL3k and SEL4k are provided in the output buffer Bk. A signal output from the selector SEL1k is input into the selector SEL3k in its input terminal D1, a constant voltage is supplied from the constant voltage source S2 to the input terminal D2, and a test control signal Tk is input into the control terminal A. A signal output from the selector SEL2k is input into the selector SEL4k in its input terminal D1, a constant voltage is supplied from the constant voltage source S1 to the input terminal D2, and a test control signal Tk is input into the control terminal A. The output terminal Y of the selector SEL3k is connected to the P-channel transistor TrPk in its gate, and the output terminal Y of the selector SEL4k is connected to the N-channel transistor TrNk in its gate. The selectors SEL3k and SEL4k perform the same selection operation as the selectors SEL1k and 2k according to the truth table in Table 1.

In the semiconductor integrated circuit having the above construction according to the second preferred embodiment of the invention, when usual operation is performed, not only the test control signal Ten but also the test control signals T1 to Tn are brought to a low level. This permits the operation of the output buffers B1 to Bk to be controlled according to the truth table in Table 2.

In measuring the resistance values of the P-channel transistors TrP1 to TrPk and the N-channel transistors TrN1 to TrNn, as with the first preferred embodiment, the test control signal Ten is brought to a high level, and, in addition, the test control signals T1 to Tn are successively switched to a high level at given period intervals.

As a result, for example, in a period where the test control signal T1 is on a high level and the test control signals T2 to Tn are on a low level, in the output buffer B1, independently of the output signal of the selector SEL11 and the selector SEL12, a constant voltage from the constant voltage source S2 is output from the selector SEL31, and a constant voltage from the constant voltage source S1 is output from the selector SEL41. Therefore, the P-channel transistor TrP1 and the N-channel transistor TrN1 are brought to an ON state. On the other hand, in the output buffers B2 to Bn, as with the first preferred embodiment, a high-level signal is output from the selector SEL12 to SEL1n, and a low-level signal is output from the selectors SEL22 to SEL2n. Therefore, a high-level signal is output from the selectors SEL32 to SEL3n, and a low-level signal is output from the selectors SEL42 to SEL4n. As a result, the P-channel transistor TrP2 to TrPn and the N-channel transistor TrN2 to TrNn are brought to an OFF state, and the external output terminals P2 to Pk are brought to a high-impedance state. Therefore, in this preferred embodiment, when a constant voltage supplied from the constant voltage source S1 is measured at the output terminal Pout1, and a constant voltage supplied from the constant voltage source S2 at the output terminal Pout2, as with the first preferred embodiment, the resistance values of the P-channel transistor TrP1 and the N-channel transistor TrN1 can be easily and accurately measured from the measurement results, the stationary current, which flows between the supply potential VDD and the ground potential GND, and the output voltage of the external output terminal P1.

Also for the output buffers B2 to Bn, in the same manner as described above in connection with the output buffer B1, the resistance values of the P-channel transistors TrP2 to TrPn and the N-channel transistors TrN2 to TrNn can be easily and accurately measured.

Further, in the second preferred embodiment of the invention, both constant voltages supplied from the constant voltage sources S1 and S2 are on a voltage level high enough to operate the transistors, to which the constant voltages are supplied, in an unsaturated region. Therefore, at the time of the measurement of the resistance value, when the P-channel transistor TrPk and the N-channel transistor TrNk, which are connected in series to each other, are simultaneously brought to an ON state, a current, which flows between the supply potential VDD and the ground potential GND through these transistors, can be made lower than that in the first preferred embodiment. This can prevent the deterioration of the semiconductor integrated circuit.

Figure 6:
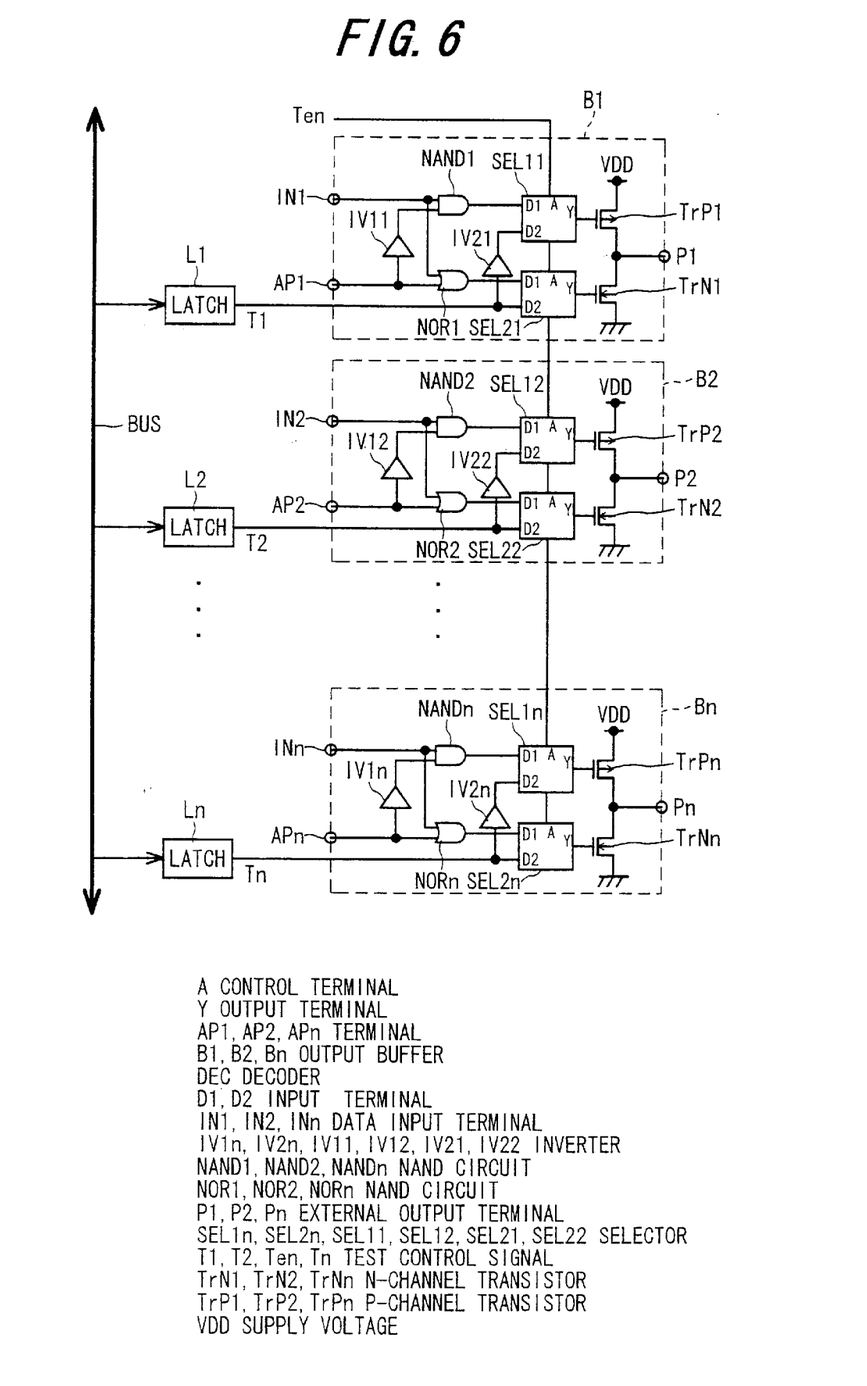
FIG. 6 is a block diagram showing the structure of a semiconductor integrated circuit according to a third preferred embodiment of the invention.

Next, the third preferred embodiment of the invention will be explained. FIG. 6 is a block diagram showing the structure of the semiconductor integrated circuit according to the third preferred embodiment of the invention. In FIG. 6 showing the third preferred embodiment and FIG. 2 showing the first preferred embodiment, like parts are identified with the same reference numerals, and the detailed description thereof will be omitted.

In the third preferred embodiment, latch circuits L1 to Ln are connected respectively between a data bus BUS and the output buffers B1 to Bn.

In the third preferred embodiment having the above construction, when the logic levels of the test control signals T1 to Tn are set by giving a write instruction to the latch circuits L1 to Ln, as with the first preferred embodiment, it becomes possible to perform usual operation of the output buffers B1 to Bn or to perform the test of the output buffers B1 to Bn.

When an external terminal for outputting test control signals T1 to Tn can be provided, for example, in a circuit for outputting data to the output buffers B1 to Bn, there is no need to provide the decoder DEC and the test signal in the first and second preferred embodiments and the latch circuits L1 to Ln in the third preferred embodiment. Further, when an external terminal for outputting a suitable constant voltage can be provided, for example, in a circuit for outputting data to the output buffers B1 to Bn, there is no need to provide the constant voltage sources S1 and S2 in the second preferred embodiment.

As is apparent from the foregoing detailed description, according to the invention, even when an IC tester is connected to a semiconductor integrated circuit through a test substrate, the resistance value of a high-drive output buffer can be measured without undergoing the influence of contact resistance attributable to the connection of the semiconductor integrated circuit to the IC tester. Further, since there is no influence of the contact resistance, for P-channel transistors and N-channel transistors respectively provided in a plurality of output buffers, a test, on whether or not the resistance value is constant, can be carried out.

The invention has been described in detail with particular reference to preferred embodiments, but it will be understood that variations and modifications can be effected within the scope of the invention as set forth in the appended claims.

What is claimed is:

1. A semiconductor integrated circuit comprising:
   a plurality of output buffers each comprising a P-channel transistor and an N-channel transistor, a drain of the P-channel transistor and a drain of the N-channel transistor commonly bonded to an external output terminal;
   a control circuit which, in measuring the resistance value of the plurality of output buffers, selects one output buffer and brings the P-channel transistor and the N-channel transistor provided in the selected output buffer to an ON state while bringing the external output terminals of the remaining output buffers to a high-impedance state; and
   a first source of a first constant voltage at which the N-channel transistors operate in an unsaturated region, said first source being selectively connected to gates of the N-channel transistors;
   a second source of a second constant voltage at which the P-channel transistors operate in an unsaturated region, said second source being selectively connected to gates of the P-channel transistor.

2. The semiconductor integrated circuit according to claim 1, wherein the control circuit, when the external output terminals of the remaining output buffers are brought to a high-impedance state, brings the P-channel transistor and the N-channel transistor provided in the remaining output buffers to an OFF state.

3. The semiconductor integrated circuit according to claim 1, wherein each of said output buffers comprises:
   a first selector which, in the selected one of said output buffers, outputs a low-level signal and, in unselected output buffers, outputs a signal on a level corresponding to the level of a signal input into a data input terminal; and
   a second selector which, in the selected one of said output buffers, outputs a high-level signal and, in unselected output buffers, outputs a signal on a level corresponding to the level of a signal input into a data input terminal.

4. The semiconductor integrated circuit according to claim 1, wherein a source of the P-channel transistor in one of said output buffers selected by the control circuit is arranged to receive a supply potential of an external tester, and a source of the N-channel transistor is arranged to receive a ground potential of an external tester.

5. A method for testing a semiconductor integrated circuit, comprising the steps of:
   providing a semiconductor integrated circuit comprising a plurality of output buffers each comprising a P-channel transistor and an N-channel transistor, the P-channel transistor in its drain and the N-channel transistor in its drain having been commonly bonded to an external output terminal;

selecting one output buffer from the plurality of output buffers;

bringing the P-channel transistor and the N-channel transistor provided in the selected one of said output buffers to an ON state connecting a gate of the P-channel transistor in the selected one of said output buffers to a first source of a first constant voltage at which the P-channel transistor operates in an unsaturated region; and connecting a gate of the N-channel transistor in the selected one of said output buffers to a second source of a second constant voltage at which the N-channel transistor operates in an unsaturated region;

bringing the P-channel transistor and the N-channel transistor provided in the remaining output buffers to an OFF state and bringing external output terminals of the remaining output buffers to a high-impedance state;

allowing a current to flow into the P-channel transistor and the N-channel transistor, which have been brought to an ON state, to measure the resistance values of the P-channel transistor and the N-channel transistor.

6. The method according to claim 5, wherein the step of measuring the resistance value is performed for all the output buffers while varying the output buffer selected by the step of selecting one output buffer.

* * * * *